United States Patent [19]

Däumer et al.

[11] Patent Number: 4,653,015
[45] Date of Patent: Mar. 24, 1987

[54] APPARATUS FOR GENERATING A TIME DURATION SIGNAL

[75] Inventors: Rolf Däumer, Weil der Stadt; Winfried Klötzner, Maulbronn; Manfred Schenk, Fellbach, all of Fed. Rep. of Germany

[73] Assignee: Robert Bosch GmbH, Stuttgart, Fed. Rep. of Germany

[21] Appl. No.: 712,339

[22] Filed: Mar. 15, 1985

Related U.S. Application Data

[63] Continuation of Ser. No. 357,116, Mar. 11, 1982, abandoned.

[30] Foreign Application Priority Data

Mar. 19, 1981 [DE] Fed. Rep. of Germany ....... 3110683

[51] Int. Cl.$^4$ ............ F02D 1/02; F02D 43/04; G06F 15/46
[52] U.S. Cl. .............. 364/569; 364/431.05; 123/417
[58] Field of Search .......... 364/569, 431.05, 431.01, 364/431.07, 486; 340/347 DR; 123/364, 416, 417

[56] References Cited

U.S. PATENT DOCUMENTS

| 4,073,270 | 2/1978 | Endo | 123/32.0 EB |
| 4,178,893 | 12/1979 | Aoki | 123/416 |
| 4,250,858 | 2/1981 | Jeenicke et al. | 123/480 |
| 4,267,810 | 5/1981 | Wesemeyer et al. | 123/416 |
| 4,327,687 | 5/1982 | Haubrer et al. | 123/416 |
| 4,354,239 | 10/1982 | Kanegae | 364/431.05 |

Primary Examiner—Parshotam S. Lall
Assistant Examiner—Thomas G. Black
Attorney, Agent, or Firm—Edwin E. Greigg

[57] ABSTRACT

An apparatus including a computer for generating a time duration signal is proposed, intended in particular for controlling fuel metering or ignition processes in internal combustion engines, wherein the time duration signal is formed in accordance with the formula $$ti = (R + K \cdot Z)/fcl$$

where Z is the counting range of a counter associated with the computer, k is the number of counting processes, fcl is the counting frequency and R is a remainder value. In accordance with the above formula, the counter first counts downward from this remainder value R and then, for a desired number k of counting processes, runs through the total counting range. In the case of an 8-bit counter, for instance, this counting range value is 256.

5 Claims, 5 Drawing Figures

APPARATUS FOR GENERATING A TIME DURATION SIGNAL

This is a continuation of copending application Ser. No. 357,116 filed Mar. 11, 1982, now abandoned.

BACKGROUND OF THE INVENTION

1. Field of the Invention

The present invention relates to an apparatus for generating a time duration signal, in particular for controlling fuel metering or ignition processes in internal combustion engines. The apparatus utilizes a computer.

2. Prior Art

In both open-loop and closed-loop control or regulation of internal combustion engines, computers are increasingly being used to enable the furnishing of precise control signals for the individual final control elements and valves, especially with a view to attaining minimal fuel consumption and the least-toxic exhaust gas possible. A computer system is known from German laid open application 28 50 534 now U.S. Pat. No. 4,250,858, in which, among other variables, the injection time of fuel injection valves is ascertained in a computer in the form of a numerical value, and this value is then converted into a time related signal. This number-to-time conversion is accomplished over a predetermined number of counting-out processes of a predetermined value in a counter. Since this counter counts down continuously beginning with the same initial value A, the total duration of the output signal with the circuitry disclosed herein follows the formula:

$$ti = A \cdot (1/fcl) \cdot k$$

where A is the respective initial value of the counter, fcl is the counting frequency and k indicates the total number of counting processes. The total time is thus composed of the sum of various identical individual time ranges A/fcl. In the known apparatus, this initial value A is first computed, and then the total number k of required counting processes.

It has now been found that despite the relative simplicity of this number-to-time converter, the expenditure for hardware is not insubstantial, since in consideration of the respective predetermined initial value of the counter, an intermediate memory for this initial value is required. On the other hand, given the high-quantity production of computer-controlled systems for motor vehicles, the expenditure for hardware should preferably be as low as possible, while a possibly somewhat greater expenditure for software might be more likely to be acceptable.

OBJECT AND SUMMARY OF THE INVENTION

It is an object of the present invention to provide an apparatus for generating a time duration signal for controlling fuel metering or ignition processes in internal combustion engines.

The apparatus includes a computer which processes signals indicative of various engine operation characteristics and at least one counter which is connected to the computer and with the computer is used to generate the time duration signal according to the formula $$ti = (R + k \cdot Z)/fcl$$

The apparatus according to the present invention for generating a time duration signal has the advantage of less expenditure for hardware than the apparatus known in the prior art. This is achieved while maintaining the same precision and basically without increased computer time.

The invention will be better understood and further objects and advantages thereof will become more apparent from the ensuing details description of preferred embodiments taken in conjunction with the drawings.

DESCRIPTION OF THE PREFERRED EMBODIMENTS

The exemplary embodiments relate to control apparatus for internal combustion engines, and in particular to the portion of the injection signal generator circuits coming last in terms of signals. The signal processing is effected digitally and under the control of a computer.

Figure 1:
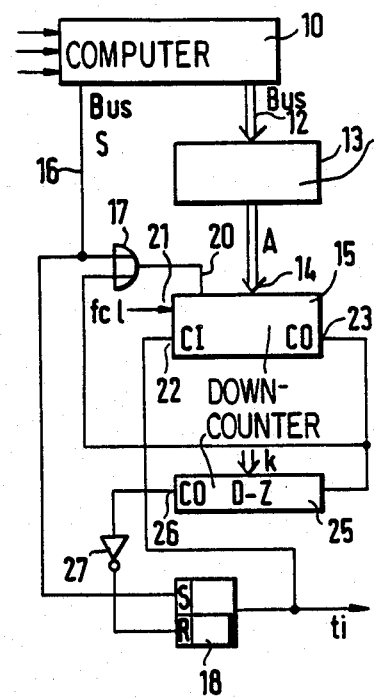
FIG. 1 is a circuit diagram of an apparatus according to the prior art.

FIG. 1, which is restricted to the most essential features, shows a number-to-time converter as found in the prior art. The computer 10 includes a data bus 12, which leads via an intermediate memory 13 to the counter state input 14 of a downward counter 15. A control bus line 16 of the computer 10 is connected to both the first input of an OR gate 17 and to the setting input of an RS flip-flop 18. The desired injection time signal ti in the embodiment according to FIG. 1 appears at the non-inverting output of the flip-flop 18, and it is delivered to a subsequent driver circuit (not shown) for the trigger signal of an injection valve. The counter 15 has, in addition to the data input 14, a charging input 20, a counting signal input 21, a CI input 22 and an overflow output 23. The charging input 20 is coupled with the output of the OR gate 17. Both the second input of the OR gate 17 and the counting input of a subsequent downward counter 25 are connected to the overflow output 23. The initial counter state of the downward counter 25, which has a value k, likewise arrives from the computer 10 via a data bus line. The output signal of this counter 25 is an overflow signal at the overflow output 26, which is delivered via an inverter 27 to the reset input of the flip-flop 18. On the output side, the flip-flop 18 is also connected to the CI input 22 of the counter 15.

Figure 2:
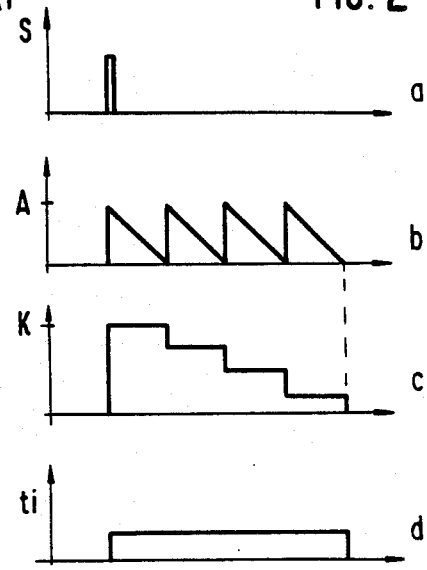
FIGS. 2a–2d illustrate the associated pulse diagrams for the apparatus of FIG. 1.

The mode of operation of the apparatus of FIG. 1, which is known per se, is best explained with the aid of the pulse diagram of FIG. 2.

If a start signal S shown in FIG. 2a appears on the control bus line 16, then the counter 15 is loaded with the value A (FIG. 2b) contained in the intermediate memory 13 and the flip-flop 18 is simultaneously set. The change in the output signal of this flip-flop 18, via the CI input 22 of the counter 15, initiates the counting process in the counter 15. An overflow signal at the corresponding output 23, via the OR gate 17, causes a new loading of the counter 15 and simultaneously causes a counting step in the second counter 25. Diagrams b and c in FIG. 2 show signals A and K representing the respective counter states of counters 15 and 25. When the predetermined counting value k has been counted out in the second counter 25, then the flip-flop 18 is reset via the inverter 27; its output signal returns to 0, which in turn effects the end of counting in the counter 15.

In the subject of FIG. 1, accordingly, a special initial value A is counted out continuously in the counter 15 until such time as a predetermined number of counting processes has been attained. The output signal ti of the flip-flop 18 thus follows the formula:

$$ti = A \cdot (1/fcl) \cdot k$$

where fcl is the counting frequency of the counter 15.

In the apparatus according to FIG. 1, an intermediate memory 13 must be included for the respective initial value A, and it is characteristic for this circuit layout that the total possible counting range of the counter 15 cannot always be fully exploited.

Figure 3:
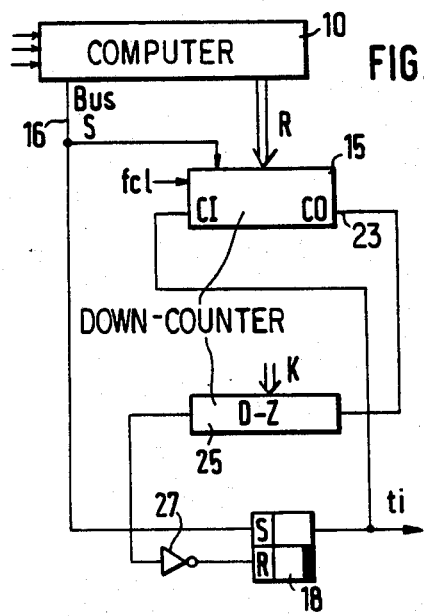
FIG. 3 is an exemplary embodiment of the apparatus according to the invention.

FIG. 3 shows the apparatus for generating a time duration signal according to the invention, which is less expensive in terms of its component elements than the apparatus of FIG. 1. Identical components and identical signal lines are indicated by identical reference numerals. It may be seen that the intermediate memory 13 and the OR gate 17 of FIG. 1 are absent here. Otherwise there is no fundamental difference.

Figure 4:
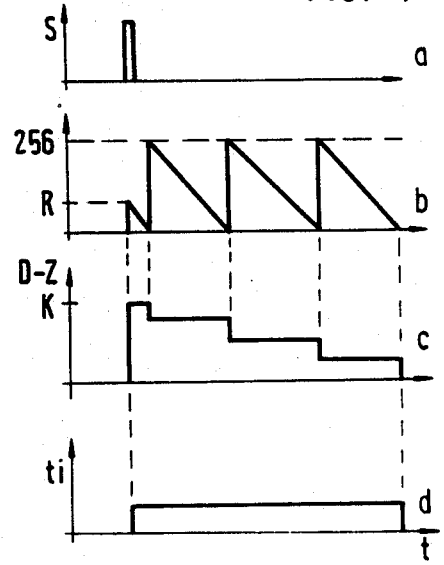
FIGS. 4a–4d illustrate the associated pulse diagrams for the apparatus of FIG. 3.

In the prior art, such as is known from U.S. Pat. No. 4,250,858, the injection time of fuel injection valves is ascertained in a computer in the form of a numerical value, and this value is then converted into a time related signal. This number-to-time conversion is accomplished over a predetermined number of counting-out processes of a predetermined value in a counter, and counts down from the same value A in each iteration. In contrast to this structure, what is of the essence is that in the apparatus of FIG. 3, the computer 10 does not provide the respective initial value A for the counter 15, but rather a remainder R. Upon the appearance of a start signal S according to FIG. 4a, this value R computed as a numerical value in accordance with engine operating characteristics, is loaded into the counter 15 and counted down from there. If the counter 15 attains the counter state value of 0, then a new initial value is not loaded as in the subject of FIG. 1; instead, the renewed counting process begins at the highest possible place, which, with an 8-bit counter, is the numerical value 255. The counting processes which now follow pass through the total numerical range of the counter 15 (see diagram b in FIG. 4) and the counting ends whenever a predetermined number of overflows has occurred, as in the subject of FIG. 1.

Expressed as a formula, the resultant value for the time duration ($t_i$) of the output signal of the flip-flop 18 is $$ti = (R + k \cdot 256)/fcl$$

where the remainder R and the total number of counting processes k are ascertained in the computer.

Because of the relationship expressed in the formula, the time duration of the output signal of the flip-flop 18 is inversely proportional to the counting frequency of the counter 15. For forming injection times, this counting down frequency is generally kept constant. If on the other hand it is intended to ascertain angular positions based on a particular reference marking, for instance to trigger an ignition process, then it is appropriate to select the counting frequency in accordance with the rpm of the crankshaft or camshaft. In this manner, an angular setting is attained via an (rpm-dependent) time determination.

The above-described apparatus shown in FIG. 3 is distinguished by its simple design, which is particularly advantageous when production in great quantity is required. Furthermore, the counter 15, which is included in the apparatus in any case, is fully exploited in terms of its available output.

Although the above-described exemplary embodiments are specialized in nature, still the apparatus can be put to use anywhere that pulses of predetermined duration have to be made available.

Figure 5:
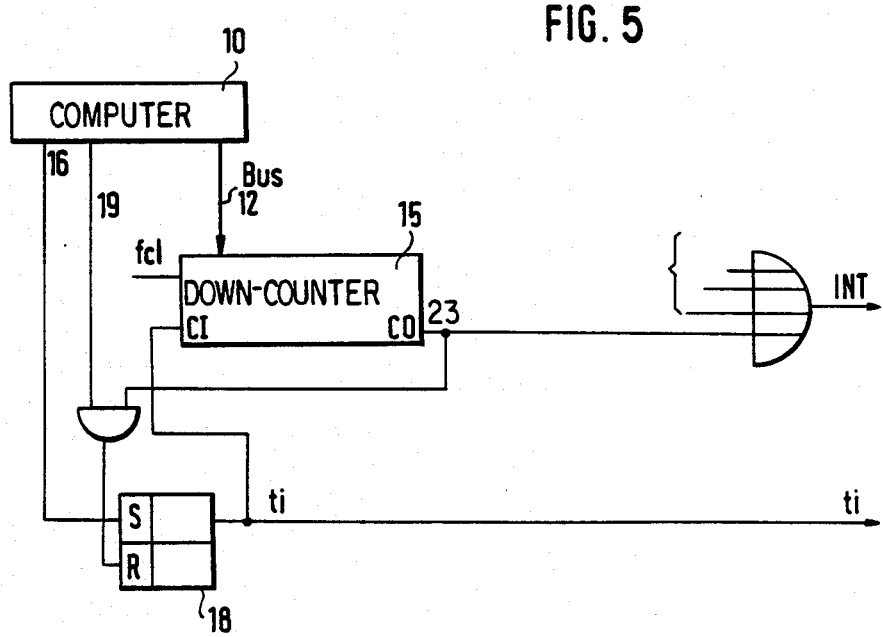
FIG. 5 is an exemplary embodiment with a software counter.

A further savings in hardware expenditure is possible if the counter 25 in the exemplary embodiment shown in FIG. 3 is replaced by a software counter in computer 10 (see FIG. 5). The overflow signal at the output 13 of the counter 15 then serves as an interrupt signal. The reset input of the flip-flop 18 must also be provided in good time by means of a control signal 19 from computer 10, so that at the correct state k of the software counter the next overflow of the counter 15 will cause the resetting of the flip-flop 18, thus terminating the time ti.

The foregoing relates to preferred exemplary embodiments of the invention, it being understood that other embodiments and variants thereof are possible within the spirit and scope of the invention, the latter being defined by the appended claims.

What is claimed and desired to be secured by Letters Patent of the United States is:

1. Signal generating means for generating time duration control signals for the control of fuel metering or ignition in an internal combustion engine, comprising:

computing means to determine for a first counting cycle an initial value dependent upon operating parameters of the engine, said computing means being arranged to supply said initial value to a first counter means and to generate a trigger signal to initiate said first counter means decrementing therefrom, said first counter means having a predetermined count capacity and being cyclically operable to decrement from said start value to zero during a first counting cycle, means responsive to an appearance of each zero value in said first counter means to cause said first counter means to perform further counting cycles from a further start value equal to said count capacity until said predetermined number of counting cycles has been completed, and means for forming time duration signals in accordance with the equation $$(R + k \cdot Z)/fcl$$

wherein Z is said count capacity, k is said predetermined number, fcl is the counting frequency of the counting means, and R is the first start value.

2. An apparatus as defined in claim 1, wherein the counting frequency is variable.

3. An appartus as defined by claim 2, wherein the counting frequency is dependent on engine shaft rpm for generating a signal indicating of the angular position of the engine shaft.

4. An apparatus as defined by claim 1, wherein the counting processes are counted with a hardware counter.

5. An apparatus as defined in claim 1, wherein the counting process are counted with a software counter.

* * * * *